United States Patent [19]

Niwayama

[11] Patent Number: 5,121,189

[45] Date of Patent: Jun. 9, 1992

[54] SEMICONDUCTOR DEVICE AND METHOD OF MANUFACTURING THE SAME

[75] Inventor: Kazuhiko Niwayama, Fukuoka, Japan

[73] Assignee: Mitsubishi Denki Kabushiki Kaisha, Tokyo, Japan

[21] Appl. No.: 605,277

[22] Filed: Oct. 30, 1990

[30] Foreign Application Priority Data

Nov. 6, 1989 [JP] Japan .................. 1-289005

[51] Int. Cl.$^5$ .................. H01L 23/42; H01L 23/44
[52] U.S. Cl. .................. 357/79; 357/81; 357/74
[58] Field of Search .................. 357/79, 74, 81, 80; 437/216

[56] References Cited

U.S. PATENT DOCUMENTS

| | | | |
|---|---|---|---|
| 3,581,160 | 5/1971 | Piccone | 437/216 |
| 4,099,201 | 7/1978 | Mueller | |
| 4,426,659 | 1/1984 | de Bruyne et al. | 357/79 |
| 4,918,514 | 4/1990 | Matsuda et al. | 357/79 |
| 4,956,696 | 9/1990 | Hoppe et al. | 357/79 |
| 4,958,215 | 9/1990 | Kojima et al. | 357/68 |

FOREIGN PATENT DOCUMENTS

| | | |
|---|---|---|
| 0124705 | 3/1984 | European Pat. Off. |
| 3006023 | 9/1980 | Fed. Rep. of Germany |
| 2936780 | 3/1981 | Fed. Rep. of Germany |
| 61-136238 | 6/1986 | Japan .................. 437/216 |
| 61-260642 | 11/1986 | Japan .................. 357/79 |
| 2162366 | 1/1986 | United Kingdom |

Primary Examiner—Andrew J. James
Assistant Examiner—Viet Q. Nguyen
Attorney, Agent, or Firm—Oblon, Spivak, McClelland, Maier & Neustadt

[57] ABSTRACT

A flat-pack type semiconductor device has an anode buffer plate (50) on a semiconductor element (1). The anode buffer plate consists of a central position (51) and a plurality of arms (61, 63) extending therefrom. Each of the arms has a straight portion (61a) placed on a guide ring (70) and a hooked-portion (61b) inserted in the gap (73) between the guide ring and an insulating cylinder (10).

18 Claims, 8 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a manufacturing method thereof, and more particularly to an improvement for preventing displacement between an electrode buffer plate and other members.

2. Description of Background Art

In a semiconductor device of a flat-pack type which is mainly used for large power circuits, members such as electrode buffer plates, electrode conductor, etc. are laid on a semiconductor substrate, and the structure thus Obtained structure is contained in an insulating cylinder. The electric buffer plates are provided in order to buffer or compensate stress in the semiconductor chip which may be caused due to difference between respective coefficients of thermal expansion of the semiconductor chip and the electrode conductors.

Figure 9A:
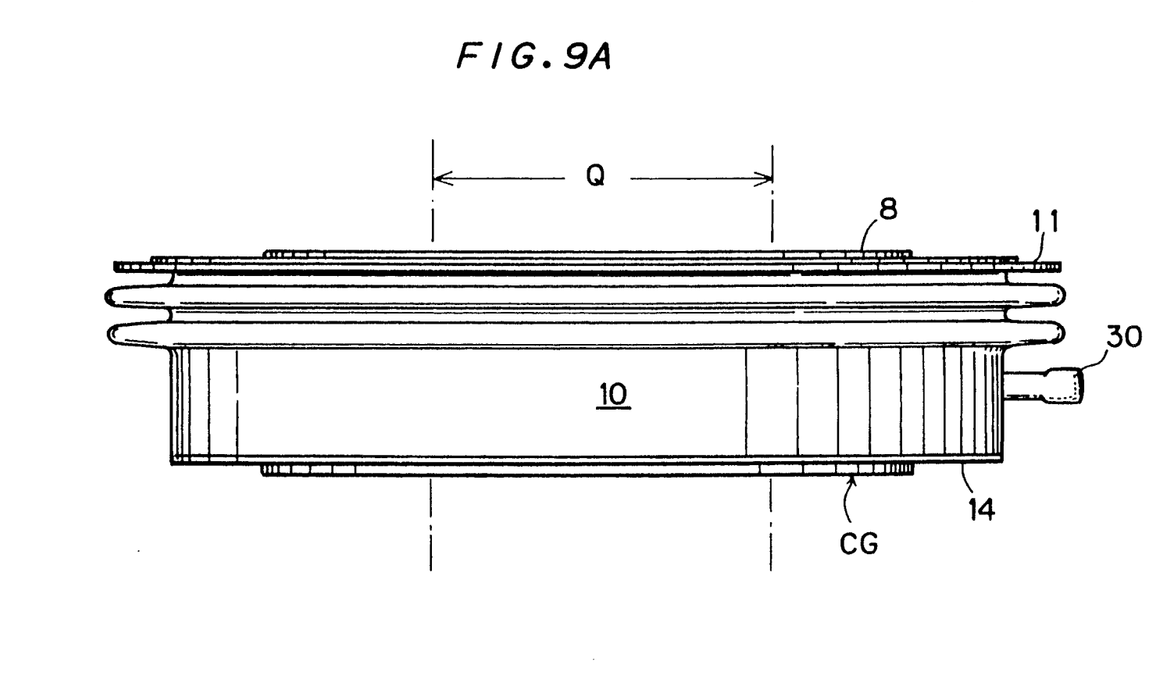
FIG. 9A is a side view of a conventional semiconductor device.
Figure 9B:
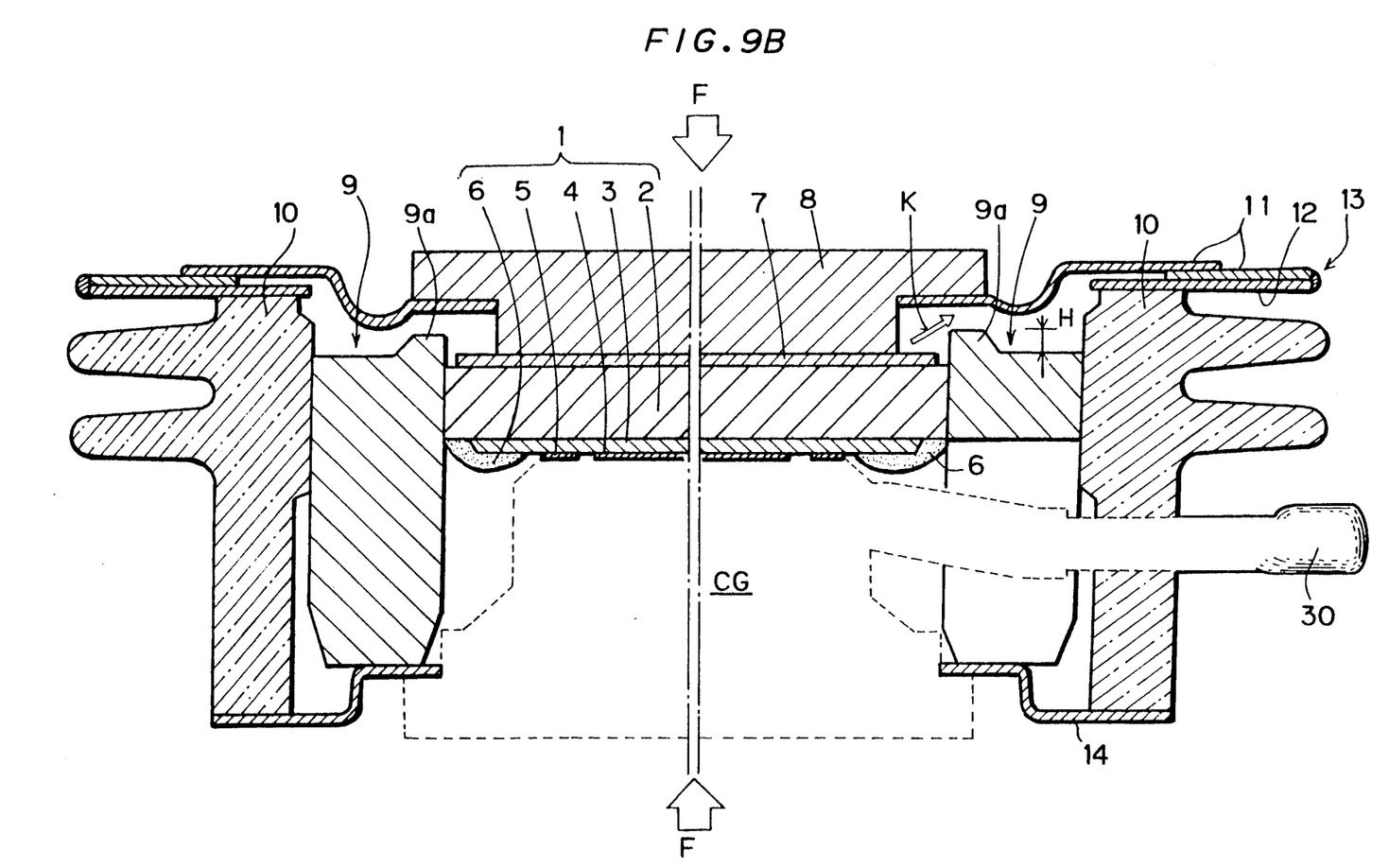
FIG. 9B is an enlarged vertical sectional view of the conventional semiconductor device with the section Q of FIG. 9A omitted.

FIG. 9A is a side view showing an appearance of a conventional semiconductor device and FIG. 9B shows an enlarged sectional view of FIG. 9A by shortening the section Q thereof to show the internal structure. In FIG. 9B, the semiconductor element I is a gate turn-off thyristor in which a cathode conductive film 4 and a gate conductive film 5 are formed in mutually separate state on the bottom major surface of a disk-shaped semiconductor substrate 3, ⓡnd the semiconductor substrate 3 is fixed by soldering to a conductive reinforcing plate 2 which acts also as an anode electrode. In the drawings, the thicknesses of these conductive films 4 and 5 are exaggerated for convenience of illustration. At the circumferential end of the semiconductor substrate 3, an insulating protective layer 6 is formed.

This semiconductor element I is inserted in an insulating guide ring 9 and the position of the element 1 in the horizontal direction in FIG. 9B is restricted by the guide ring 9. The guide ring 9 is internally fitted to the insulating cylinder 10. On the top surface of the reinforcing plate 2, there are placed an anode buffer plate 7 and the anode conductor 8 in this order. The position of the anode buffer plate 7 in the horizontal direction is restricted by the projection 9a of the guide ring 9. To the anode conductor 8, there is fixed an anode flange 11. The other flange 12 which is fixed to the end part of the insulating cylinder 10 and the anode flange 11 are arc-welded at the edge 13.

Underneath the semiconductor element there is a cathode/gate assembly CG whose outer shape is shown by broken lines. This cathode/gate assembly CG includes a cathode buffer plate and a cathode conductor, and has members which constitute an electrical channel from the gate conductive film 5 to a gate terminal 30. Also, the cathode/gate assembly CG is connected by a cathode flange 14 to the insulating cylinder 10. When a control signal is supplied to the gate terminal 30, the electrical channel between the bottom surface of the cathode/gate assembly CG and the anode conductor 8 is opened or closed by the switching action of the semiconductor substrate 2.

The semiconductor device of FIG. 9B is assembled on the premise of being used under the condition where certain pressure represented by an arrow F—F is applied to the anode conductor 8 and the cathode/gate assembly CG. In other words, by such pressure, uniform electrical contacts between respective members are maintained, and thereby normal operation of the semiconductor device is attained.

However, before assembling this semiconductor device into an electric equipment, no such pressure is applied. Accordingly, in case of transporting such semiconductor device before assembling the same into an electric equipment, it may occur for the anode conductor 8 to float up by vibration in the transportation and the like. This is because the anode flange 11 is formed of a soft metal such as copper and is often deformed by vibration and the like.

When the floating occurs, a gap is formed between the anode conductor 8 and the reinforcing plate 2, and the anode buffer plate 7 is displaced to pass over the projection 9a of the guide ring 9, as shown by the arrow K. If such displacement occurs, it becomes no longer possible to maintain uniform contact between respective members. As a result, current distribution in the semiconductor substrate 3 in operation becomes non-uniform to cause abnormal generation of heat or breakdown of the substrate 3.

In order to prevent such a problem, there may be an improvement to make the height H of the projection 9a higher. However, as the gap in the vertical direction between the guide ring 9 and the anode flange 11 is relatively narrow, it is difficult to take the height H of the projection 9a sufficiently high.

SUMMARY OF THE INVENTION

According to the present invention. a semiconductor device comprises (a) a semiconductor element having: (a-i) a semiconductor substrate having top and bottom major surfaces; (a-2) a first electrode provided on the top major surface; and (a-3) a second electrode provided on the bottom major surface; (b) an electrode buffer plate which is provided on and is in contact with the first electrode; (c) a first electrode conductor which is provided on and is in contact with the electrode buffer plate; (d) a second electrode conductor which is provided on and is electrically connected to the second electrode; (e) a guide ring into which the semiconductor element is inserted and which restricts a position of the semiconductor element; and (f) an insulating cylinder into which the guide ring is inserted and which is connected to the first and second electrode conductors: wherein the electrode buffer plate comprises: (b-1) a central portion having a diameter adapted to an inner diameter of the guide ring; and (b-2) at least one arm which extends from the central portion to a vicinity of an inner wall surface of the insulating cylinder.

Preferably, the electrode buffer plate has a plurality of arms each of which has the shape of a hook.

The present invention is also directed to a method of manufacturing a semiconductor device in which a semiconductor element is inserted between first and second electrode conductors and the semiconductor element includes a semiconductor substrate having top and bottom major surfaces on which first and second electrodes are provided.

According to the present invention the method comprises the steps of: (a) obtaining an insulating cylinder having top and bottom openings; (b) obtaining a structure in which the second electrode conductor is inserted into the bottom opening, the insulating cylinder is connected to second electrode conductor, and a guide ring is inserted into a center portion of a space surrounded by the insulating cylinder; (c) introducing the semiconductor element from the top opening to the space with the second electrode facing to the second electrode conductor to thereby insert the semiconductor element into the guide ring; (d) introducing an electrode buffer plate from the top opening to the space and placing the electrode buffer plate on the semiconductor element, wherein the electrode buffer plate comprises: a central portion having a diameter corresponding to an inner diameter of the guide ring; and at least one arm extending from the central portion; (e) placing the first electrode conductor on the electrode buffer plate through the top opening; and (f) connecting the first electrode conductor to the insulating cylinder; wherein a size of the arm is determined such that the arm reaches a vicinity of an inner surface of the insulating cylinder when the electrode buffer plate is placed on the semiconductor element in the step (d).

According to the present invention, since the arm of the electrode buffer plate is extended to the neighborhood of the inner wall surface of the insulating cylinder, the position of this electrode buffer plate is substantially restricted by the inner wall surface of the insulating cylinder. Therefore, it does not occur for the electrode buffer plate to be displaced largely in the radial direction of the guide ring.

Accordingly, an object of the present invention is to provide a semiconductor device and a method of manufacturing the same in which an electrode buffer plate is hardly displaced over a guide ring.

These and other objects, features, aspects and advantages of the present invention will become more apparent from the following detailed description of the present invention when taken in conjunction with the accompanying drawings.

DESCRIPTION OF PREFERRED EMBODIMENTS

A. Overall Structure

Figure 1A:
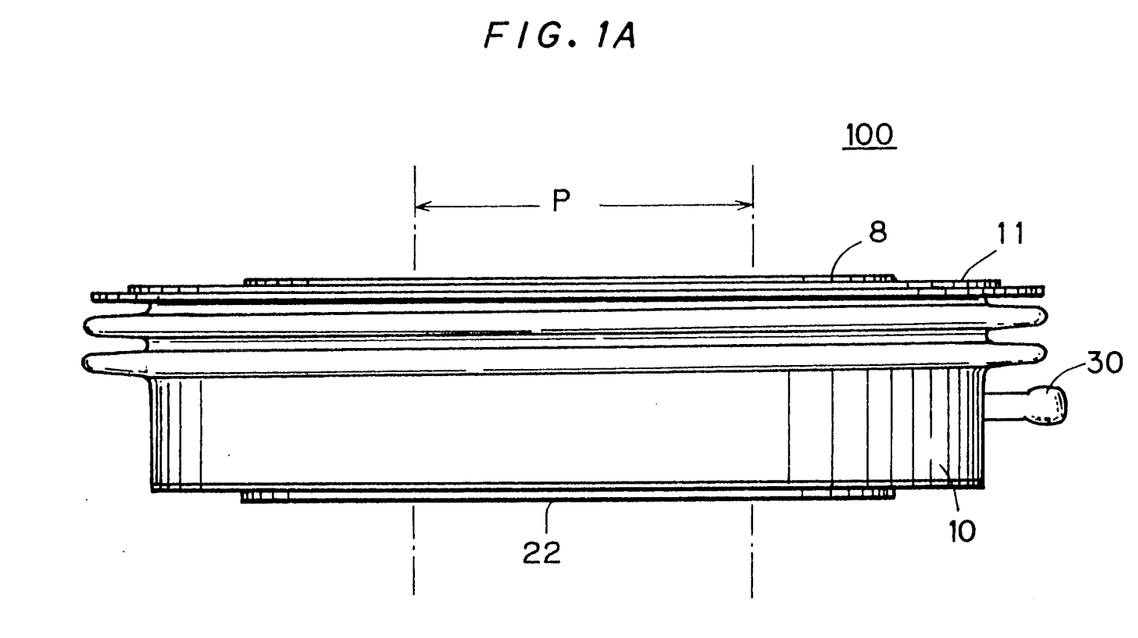
FIG. 1A is a side view of a semiconductor device according to a preferred embodiment of the present invention.
Figure 1B:
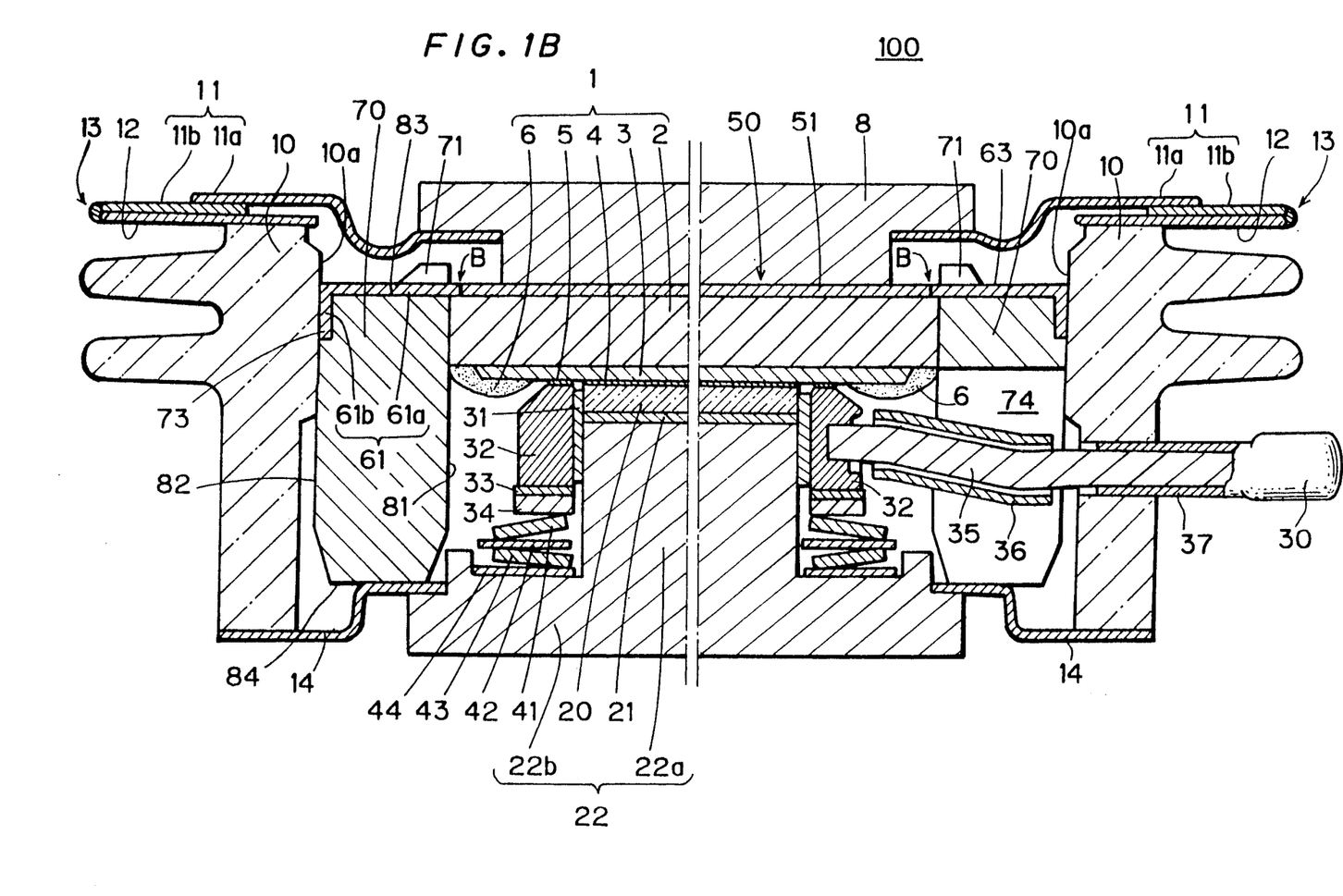
FIG. 1B is an enlarged vertical sectional view of the semiconductor device in which part corresponding to the section P in FIG. 1A is omitted.

FIG. 1A is a side view of a semiconductor device 100 of a flat-pack type according to a preferred embodiment of the present invention, and FIG. 1B shows an enlarged sectional view drawn by omitting the section P of FIG. 1A. This semiconductor device 100 has a disk-shaped semiconductor substrate 3 corresponding to the body of a gate turn off thyristor. In the semiconductor substrate 3, there exist a plurality of active regions formed by doping impurities.

A disk-shaped reinforcing plate 2 made of an electric conductor is soldered on a first major surface of the semiconductor substrate (silicon substrate) 3. The reinforcing plate 2 serves as an anode plate. On the other hand, on a second major surface of the semiconductor substrate 3, a cathode conductive film 4 and a gate conductive film 5 both of which are made of aluminum are formed in mutually separate state. The circumferential edge portion of the semiconductor substrate 3 is covered with an insulating protective layer 6. A semiconductor element 1 is constituted by these members 2-6.

The semiconductor element 1 is fitted in the inner wall surface 81 of an insulating guide ring 70 which has an inner diameter substantially equal to the diameter of the reinforcing plate 2. Accordingly, the position in the horizontal direction of the semiconductor element 1 is restricted by the guide ring 70. Details of the shape of the guide ring 70 will be described later. The guide ring 70 is internally fitted in to the inner wall surface 10a of an insulating cylinder 10 made of alumina ceramic.

On the other hand, on the bottom surface of the cathode conductive film 4, there are disposed a first cathode buffer plate 20 and a second cathode buffer plate 21 each of which has a disk form. These buffer plates 20 and 21 are provided to buffer or compensate thermal stress caused by the difference of the respective thermal expansion coefficients between the substrate 3 and a cathode conductor 22 when a current flows through the semiconductor substrate 3. For this reason, the cathode buffer plate 20 is made of a material, e.g., molybdenum, having a thermal expansion coefficient close to that of the semiconductor substrate 3. The other cathode buffer plate 21 is made of copper, for example.

The cathode conductor 22 is formed of copper, and has a central portion 22a shaped as a thick disk and a bottom portion 22b shaped as a wide disk. The central disk portion 22a is in direct contact with the second cathode buffer plate 21. Accordingly, the cathode conductor 22 is to be in electrical contact with the cathode conductive film 4 in the semiconductor element 1 through the cathode buffer plates 20 and 21. A cathode flange 14 made of iron-nickel alloy is fixed to the outer periphery of the disk bottom portion 22b. The cathode flange 14 is also fixed to the bottom end part of an insulating cylinder 10, whereby the cathode conductor 22 is connected to the insulating cylinder 10. The bottom surface 84 of the guide ring 20 is in direct contact with the cathode flange 14.

On the disk bottom portion 22b of the cathode conductor 22 there are provided a couple of conical springs 41 and 43 alternately with a couple of flat washers 42 and 44 so as to surround the central disk portion 22a. A flat washer 34 and an insulating ring 33 is provided on the conical spring 43. A gate ring 32 made of a electric conductive material is provided on the insulating ring 33. Preferably, the gate ring 32 is formed of a conductive material having a thermal expansion coefficient close to that of the semiconductor substrate 3.

The gate ring 32 is externally fitted to the cathode buffer plates 20 and 21 and the cathode conductor 22 through the insulating member 31 provided around the members 20 and 21 and the upper portion of the cathode conductor 22. The top of the gate ring 32 is in direct contact with the gate conductive film 5. The gate ring 32 is forced to by the conical springs 41 and 43 toward the gate conductive film 5 to attain electrical contact between the gate ring 32 and the gate conductive film 5.

A gate lead 35 projecting to the external space of the insulating cylinder 10 is connected to the gate ring 32. This lead 35 is inserted into a tubular insulating sleeve 36 and passes through a notched space 74 of the guide ring 70. The end part of the gate lead 35 is unified with the end part of a metal pipe 37 by arc-welding, by which a gate terminal 30 is formed. The electrical gate channel and the electrical channel on the cathode side are electrically insulated from each other by the insulating members 31 and 32.

An anode buffer plate 50 which is formed, for example, of copper is placed on the reinforcing plate 2. This anode buffer plate 50 buffers or compensates thermal stress in the semiconductor substrate 3 on the anode side. As will be described in detail later, the anode buffer plate has a disk-shaped center portion 51 and four hook-shaped arms 61-64 radially extending from the center portion 5 (refer to FIG. 2 to be described later). In FIG. 1B, there re shown only the two arms 61 and 63 out of them. The boundaries between the center portion 51 and the arms 61-64 are depicked by the lines B in FIG. 1B.

In FIG. 1B, the arm 61 has a first portion 61a extending horizontally from the center portion 51 and a second portion 61b extending downward by bending at the terminal end o: the first portion 61a. The first portion 61a is in direct contact with the surface area 83 which is a portion of the top surface of the guide ring 70. The second portion 61b is positioned extremely near the inner wall surface 10a of the insulating cylinder 10, and is inserted in a gap 73 between the insulating cylinder 10 and the guide ring 70. Other arms 62-64 have the same structure as the arm 61. The positional relationship between the anode buffer plate 50 and the members surrounding the same will be described later.

A copper anode conductor 8 is provided on the anode buffer plate 50. The shape of the anode conductor 8 is a disk having a step. An anode flange 11 having a copper part 11a and an iron nickel alloy part 11b is fixed to the step of the anode conductor 8. Another flange 12, which is fixed to the top surface of the insulating cylinder 10, and the anode flange 11 are arc-welded at their respective edges 13, whereby the anode conductor 8 and the insulating cylinder 10 are connected.

The semiconductor device 100 of FIG. 1B is turned on or turned off by applying a voltage from outside between the cathode conductor 22 and the anode conductor 8 thereof and giving a control signal from the gate electrode 30.

B. Details of Anode Buffer Plate 50 and Guide Ring 70

Figure 2:
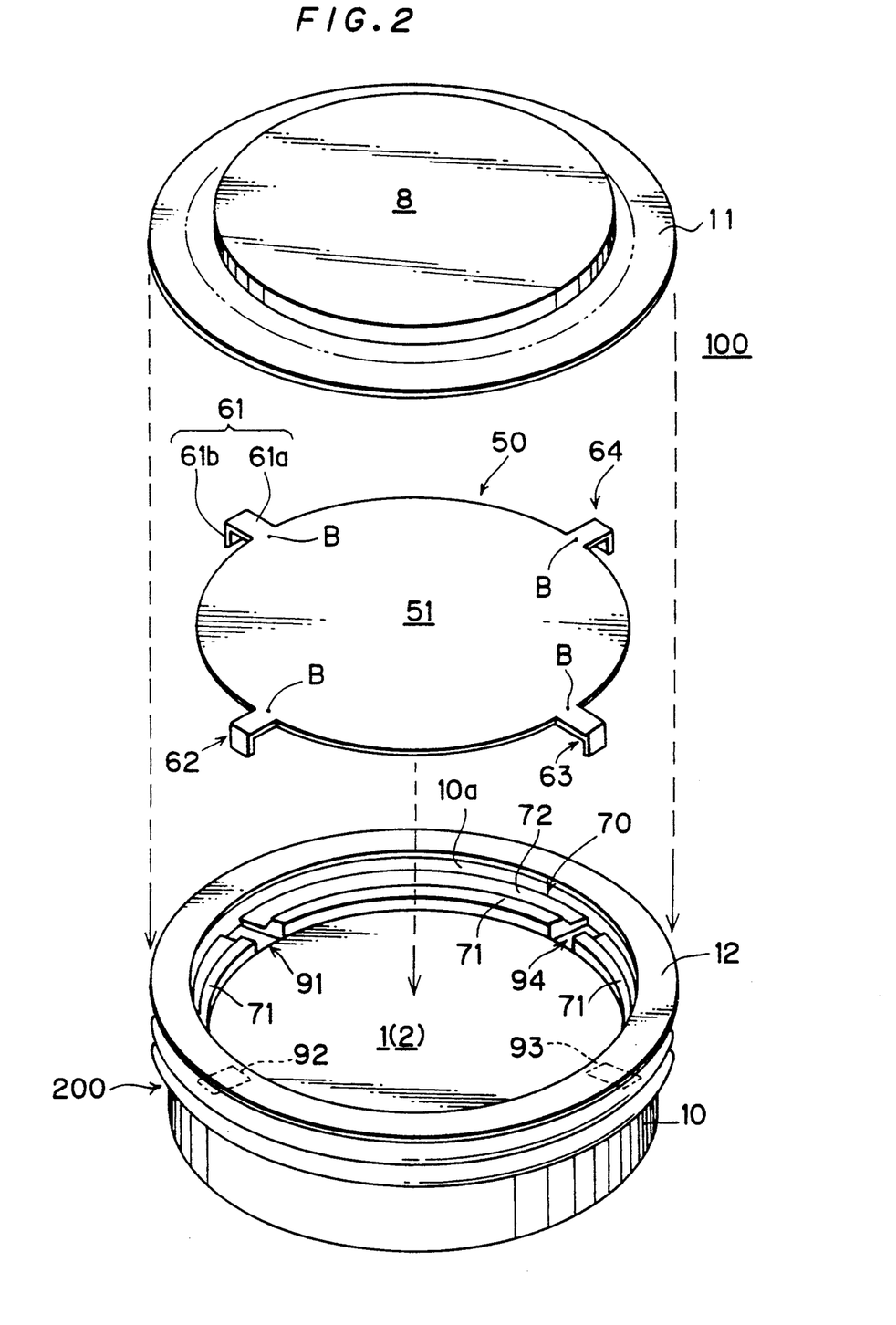
FIG. 2 is a perspective view of the semiconductor device with part exploded.
Figure 3:
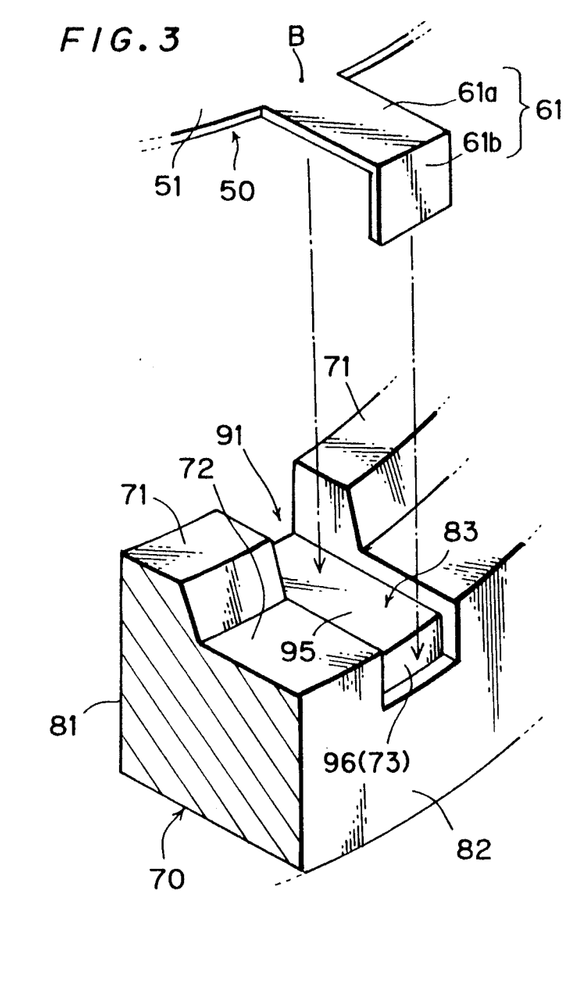
FIG. 3 is an enlarged partial view showing the detailed constitution of an anode buffer plate and a guide ring.

FIG. 2 is a perspective view of the semiconductor device 100 with part exploded, and FIG. 3 is an enlarged partial view of the anode buffer plate 50 and the guide ring 70 with part taken away.

In FIG. 2, the four arms 61-64 are united with the center portion 51, being arranged at equal intervals along the circumference of the center portion 51. The projection or bank 71 of the guide ring 70 is a circular ring surrounding the upper space of the reinforcing plate 2, and four notches or grooves 91-94 extending in the radial direction are formed in the top portion of the guide ring 70. The respective widths of the notches 91-94 are made substantially the same as the respective widths of the arms 61-64. In accordance with the arrangement of the arms 61-64, the notches 91-94 are also arranged at equal intervals along top circumference of the guide ring 70. Accordingly, when the anode buffer plate 50 is placed on the top surface of the reinforcing plate 2 which is included in the structure 200 as shown by broken arrows, the notches 91-94 can receive the arm 61-64, respectively.

In FIG. 3, the notch 91 is constituted by a combination of a horizontal channel 95 formed across the top surface of the guide ring 70 and a recess 96 bent toward an outer wall surface 82 of the guide ring 70 from the horizontal channel 95. The horizontal channel 95 is adapted to the first portion 61a of the arm 61, and the recess 96 is adapted to the second portion 61b. When the guide ring 70 is internally fitted to the insulating cylinder 10 of FIG. 1B, the recess 96 becomes the gap 73.

Figure 4:
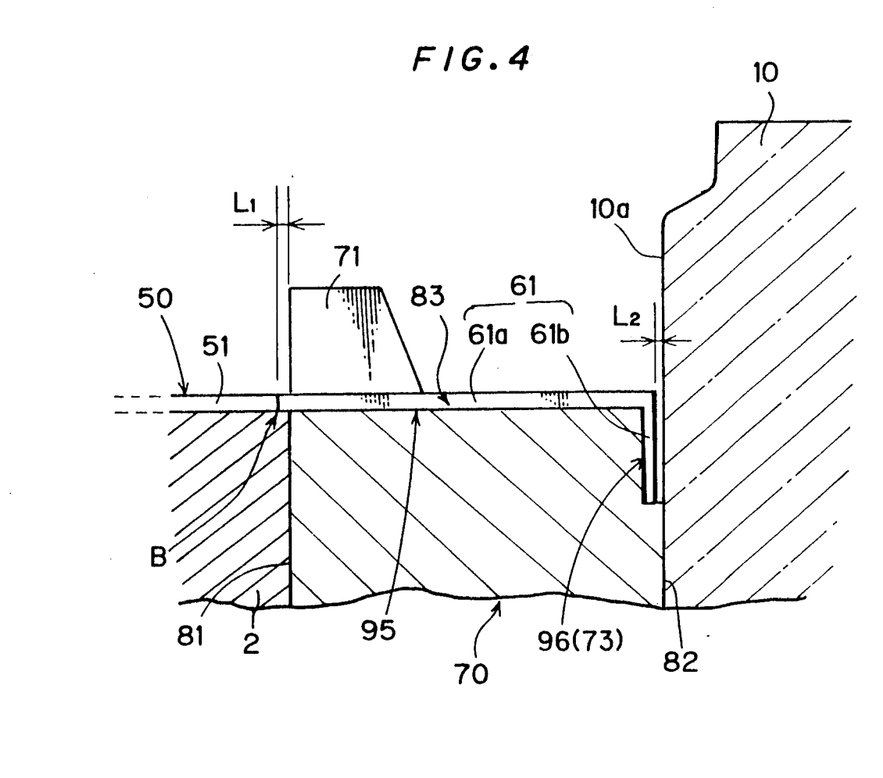
FIG. 4 illustrates an arm of the anode buffer plate accommodated in a notch of the guide ring.

The condition in which the arm 61 is accommodated in the notch 91 is shown in FIG. 4. The boundary B between the center portion 51 and the arm 61 in the anode buffer plate 50 is distant from the inner wall surface 81 of the guide ring 70 by a small distance $L_1$. By providing such a distance $L_1$, it becomes easy to introduce the anode buffer plate 50 into a space over the reinforcing plate 2 surrounded by the guide ring 70. This distance $L_1$ also functions as a clearance when the center portion 51 is thermally expanded. The second portion 61b of the arm 61 is separated from the inner wall surface 10a of the insulating cylinder 10 by a small instance $L_2$. By the presence of this distance $L_2$, insertion of the second portion 61b into the gap 73 is facilitated, and the clearance of the anode buffer plate 50 for thermal expansion is also secured. The width of the gap 73 is made slightly larger than the thickness of the second portion 61b in order to provide the distance $L_2$.

Although FIGS. 3 and 4 are drawn to show the arm 61 and the notch 91, the structures of them are the same with respect to other arms 62-64 and notches 92-94.

Suppose a state where the device 100 is vibrated in transportation therefore and the anode conductor 8 in FIG. 1B is floated up. At this time, a pressure to press downward the anode buffer plate 50 is decreased. However, because the arm 61 is extended to a position in the vicinity of the inner wall surface 10a of the insulating cylinder 10, the displacement of the anode buffer plate 50 in the horizontal direction is no more than the distance $L_1$ in FIG. 4. Accordingly, the displacement of the anode buffer plate 50 in the horizontal direction is substantially prevented, and the movements of the anode buffer plate 50 by the vibration become only those in the vertical direction. These movements in the vertical direction do not give any serious problems to the anode buffer plate 50. This is because the anode buffer plate 50 returns to the original position after stoppage of the vibration. In other words, because the displacement of the anode buffer plate 50 in the horizontal direction is prevented, irreversible displacement of the anode buffer plate 50 is not caused.

When, as in this preferred embodiment, the arms 61-64 are formed in hook shape and the front end portions thereof inserted into the gap ? 3, the effect in preventing the displacement is further enhanced. That is to say, even if vibration is applied to the anode buffer plate 50, because the front end portions of the arms 61-64 are always maintained vertically downward in the corresponding gaps 73, the anode buffer plate 50 cannot be inclined. As a result, the irreversible displacement of the anode buffer plate 50 is more effectively prevented.

Further, as the arms 61-64 are accommodated in the notches 91-94, rotation of the anode buffer plate 50 in the horizontal plane is also prevented. Accordingly, irreversible displacement caused by the combination of rotation and linear translation of the anode buffer plate 50 is also prevented. The notches 91-94 are also useful in fabricating the semiconductor device 100. That is to say, because of the provision of the conical springs 41 and 43 of FIG. 1B, upward spring forces are applied to the semiconductor element 1 and the anode buffer plate 50 through the gate ring 32 before placing the anode conductor 8 thereon, and these members 1 and 50 are in slightly upper positions than those shown in FIG. 1B. The anode conductor 8 is then placed on these members and 50, and with downward force applied to them, the anode flange is welded to the flange 12. At this time, the members I and 50 can sink slightly downward against the forces from the conical springs 41 and 43, since the clearances for the arms 61-64 for sinking are provided by the notches 91-94.

In order to adapt the anode buffer plate 50 to the top surface of the guide ring 70 without providing the notches 91-94, the whole top surface of the guide ring 70 may be flattered at the level of the bottom surface of the channel 95. However, when the top surface of the guide ring 70 is completely flattered to remove the projection 71, the restriction of the displacement of the buffer plate 50 by the projection 71 is forfeited. Accordingly, it is preferred that the notches 91-94 are formed with the projection 71 left, and the arms 61-64 are accommodated in the notches 91-94 while preventing displacement of the anode buffer plate 50 by both of the arms 61-64 and the projection 71.

C. Manufacturing Process for Semiconductor Device 100

The semiconductor device having the above-mentioned structure may be assembled through the following sequence:

First, respective members of the semiconductor device 100 is individually manufactured. The diameter of the center portion 51 of the anode buffer plate 50 is made smaller than the inner diameter of the guide ring 70 by $2L_2$. The length of the first portion 61a of the respective arms 61-64 is set to be larger by $L_2$ than the horizontal distance from the inner wall surface 81 of the guide ring 70 to the gap 73 in FIG. 4. As the distances $L_1$ and $L_2$ are both very small, the diameter of the central portion 51 is approximately equal to the inner diameter of the guide ring 70, and the length of the first portion 61a is approximately equal to the thickness of the guide ring 70.

The central portion 51 and the arms 61-64 are formed in one piece by, for example, punching a copper plate, and the anode buffer plate 50 is obtained by bending the respective second portions 61b of the arms 61-64. The guide ring 70 is provided with a projection 71 and notches 91-94.

Out of the members thus manufactured, the members excluding the semiconductor element 1, the anode buffer plate 50, the anode conductor 8 and the anode flange 11, are assembled in accordance with FIG. 1B. In the structure thus obtained, the anode conductor 22 and the members surrounding it are inserted in the lower opening side of the insulating cylinder 10, and the cathode conductor 22 and the insulating cylinder 10 are connected by the cathode flange 14. Also, the cathode buffer plates 20 and 21 are provided on the cathode conductor 22. Further, the guide ring 70 is internally fitted at approximately the central portion of the inner space of the insulating cylinder 10.

Next, the semiconductor element with the cathode conductive layer 4 directed downward is introduced from the upper opening of the insulating cylinder 10 to the inner space thereof. The semiconductor element I is internally fitted to the guide ring 70. The structure 200 in FIG. 2 shows the state where this stage has been completed.

Further, the anode buffer plate 50 is introduced from the upper opening of the insulating cylinder into the inner space thereof. The central portion 51 of the anode buffer plate 50 is placed on the reinforcing plate 2, and the arms 61-64 are disposed on the notches 61-64, respectively.

Next, the anode conductor 8 to which the anode flange 11 is previously fixed is placed on the anode buffer plate 50 from the upper opening of the insulating cylinder 10. Downward pressure is applied to the anode conductor 8, so that the anode buffer plate 50 and the semiconductor element slightly sink against the forces by the conical springs 41 and 43, and the arms 61-64 come into contact with the bottom parts of the respective channels 95 of the notches 91-94.

In this state, the end part 13 of the anode flange 11 is arc-welded to the end part of the flange 12 which is previously fixed to the top surface of the insulating cylinder 10, whereby the anode conductor 8 and the insulating cylinder 10 are connected with each other through the flanges 11 and 12.

By the abovementioned steps, the semiconductor device 100 as shown in FIG. IB is obtained.

D. Other Embodiments

Figure 5:
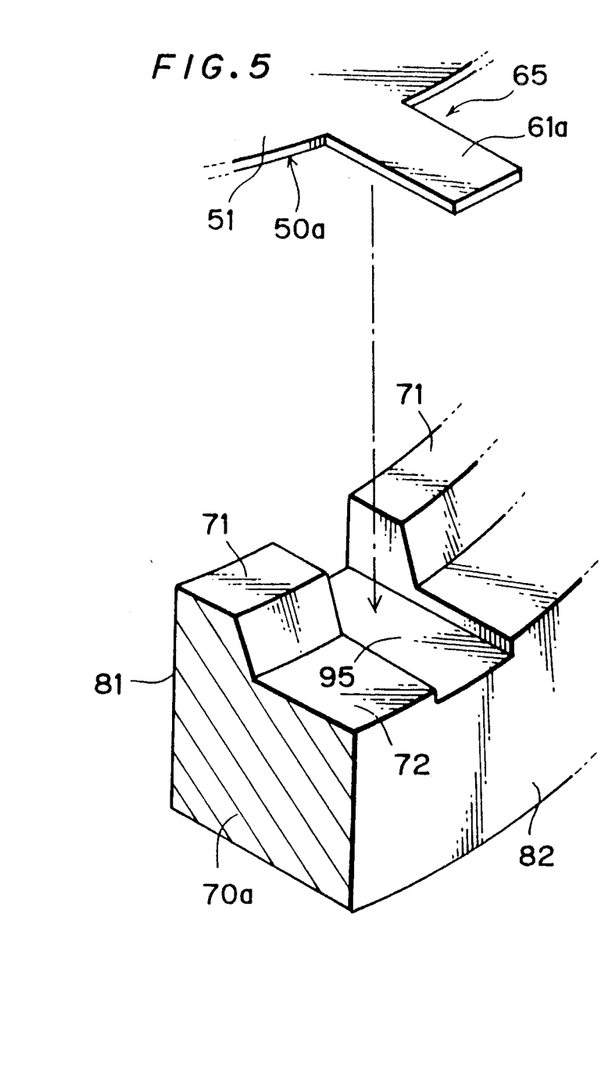
FIGS. 5 and 6 are views showing other shapes of the arm.

FIG. 5 illustrates an anode buffer plate according to another preferred embodiment of the present invention. The anode buffer plate 50a have a plurality of arms 65, only one of which is shown in FIG. 5. Each arm 65 has a horizontal portion 61a only and respective notches of a gate ring 70a have the horizontal channels 95 only.

Figure 6:
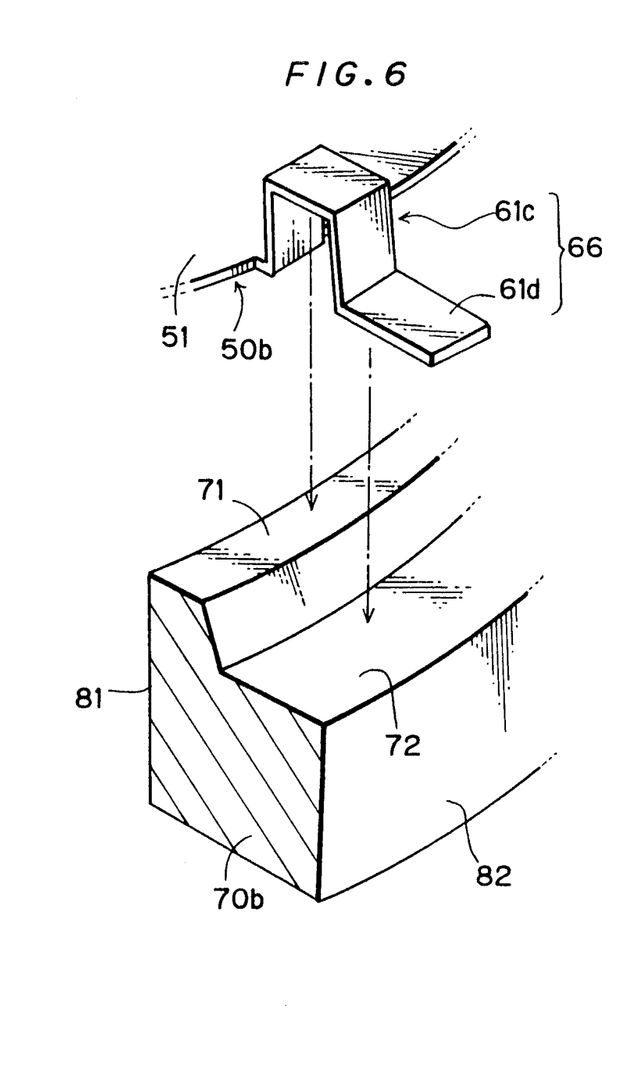

FIG. 6 shows another anode buffer plate 50b. Respective arms 66 of the anode buffer plate 50b have bridge portions 61c and horizontal portions 61d. The bridge portion 61c straddles a projection 71 of a gate ring 70b. These arms 66 are used in combination with the gate ring 70b having on notch. In each of FIG. 4 and FIG. 5, the ends of the horizontal portions 61a and 61d extend to the place very near the inner wall surface 10a of the insulating cylinder 10 shown in FIG. 1B.

Figure 7:
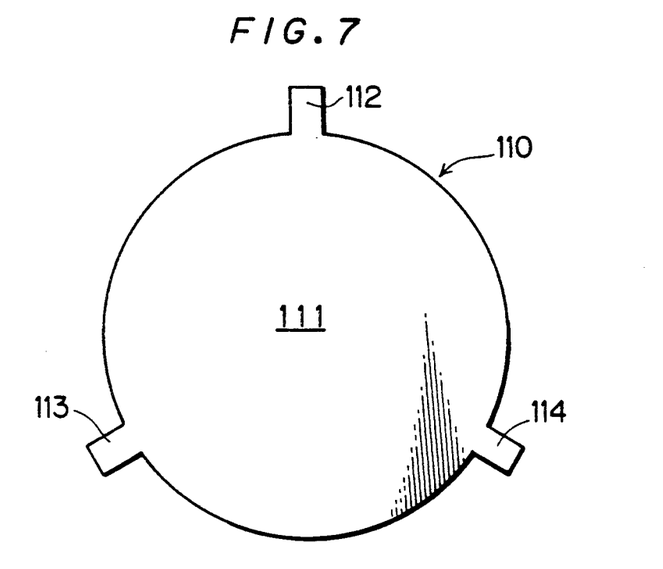
FIGS. 7, 8A and 8B are views showing other example of the anode buffer plate.

FIG. 7 is a plane view of an anode buffer plate 110 having three arms 112-114. The arms 112-114 are disposed at equal intervals on the circumference of a circular central portion 111. Each of the arms 112-114 may be the same as the arm 61 as shown in FIG. 3, or may be the same as either of the arms 65 and 66 as shown in FIG. 5 and FIG. 6. In general, if there are provided three or more arms around the central portion, two dimensional positioning of the anode buffer plate is always attained.

Figures 8A, 8B:
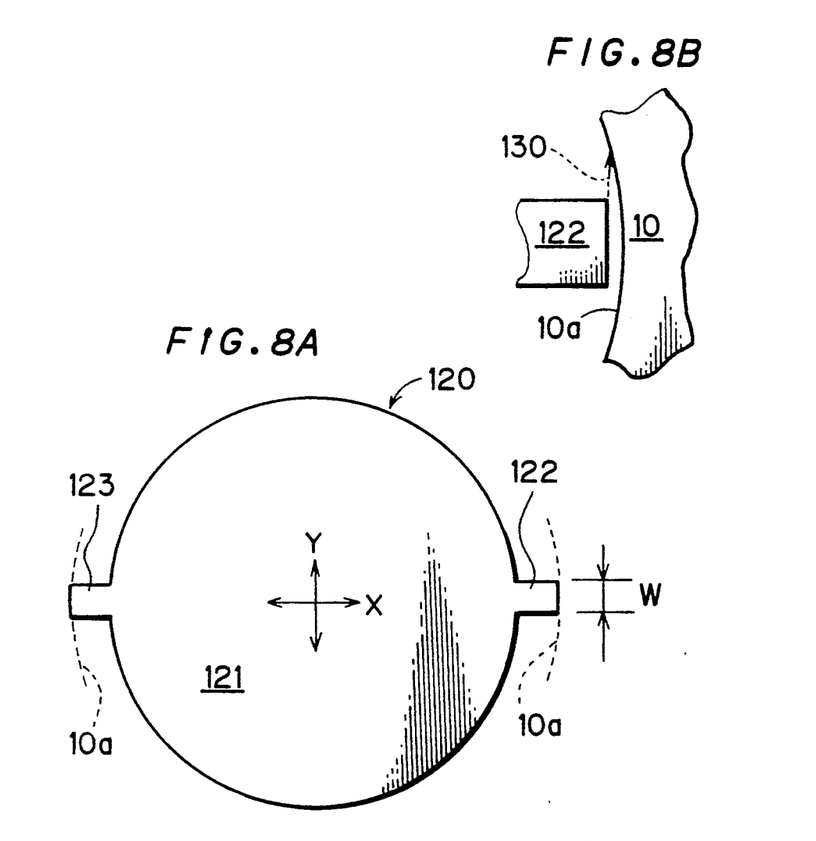

An anode buffer plate 120 of FIG. 8A has two arms 122 and 123 aligned across the diameter of a central portion 121. When the direction of mutually connecting the arms 122 and 123 is denoted as X, displacement of the anode buffer plate 120 in the direction X is prevented by the arms 122 and 123. Further, when the respective widths W of the arms 122 and 123 are made relatively large, only a slight displacement of the anode buffer plate 120 in the direction Y causes the ends of the arms 122 and 123 to be in direct contact with the inner wall surface 10a of the insulating cylinder 10, as shown in a broken arrow 130 in FIG. 8B. Accordingly, when the width W is so defined that the ends of the arms 122 and 124 come into direct contact with the inner wall surface 10a by displacements smaller than a predetermined maximum allowable displacement in the direction Y, large displacement of the anode buffer plate 120 in the direction Y can be prevented.

Further, when a hook shaped arm is provided as in the arm 61 of FIG. 3, even by providing only a single arm the two-dimensional positioning of the anode buffer plate is attained. Therefore, the number of the arms in an anode buffer plate is not limited and an anode buffer plate having an arbitrary number of arms can be employed.

The semiconductor devices to which the present invention is applicable are not limited to the gate turn-off thyristor. The present invention is applicable for example to other thyristors and transistors, and also to the elements having no control electrode such as diodes. With respect to the elements in which the upper side of FIG. 1B is a cathode, the present invention is applicable to the cathode buffer plate.

E. Conclusion

As described above, according to the present invention, an electrode buffer plate is provided with at least one arm, so that displacement of the electrode buffer plate over a passing over the guide ring can be effectively prevented.

Further, displacement of the electrode buffer plate can be further effectively prevented by inserting the end portion of the arm into the gap between the guide ring and an insulating cylinder.

Furthermore, according to the manufacturing method of the present invention, a semiconductor device corresponding having the above-indicated advantage can be obtained without providing any complicated process.

Although the present invention has been described and illustrated in detail, it is clearly understood that the same is by way of illustration and example only and is not to be taken by way of limitation. The spirit and scope of the present invention should be limited only by the terms of the appended claims.

I claim:
1. A semiconductor device comprising:
a semiconductor element which comprises:
a semiconductor substrate having top and bottom major surfaces;
a first electrode provided on said top major surface; and
a second electrode provided on said bottom major surface;
an electrode buffer plate which is provided on and is in contact with said first electrode, wherein said electrode buffer plate buffers a thermal stress caused when a current flows through said semiconductor substrate;
a first electrode conductor which is provided on and is in contact with said electrode buffer plate;
a second electrode conductor which is provided on and is electrically connected to said second electrode;
a guide ring into which said semiconductor element is inserted and which restricts a position of said semiconductor element; and
an insulating cylinder into which said guide ring is inserted and which is connected to said first and second electrode conductors;
wherein said electrode buffer plate comprises:
a central portion having a diameter adapted to an inner diameter of said guide ring, wherein said central portion is larger than a diameter of said semiconductor substrate; and
at least one arm which extends from said central portion to a vicinity of an inner wall surface of said insulating cylinder.

2. The semiconductor device of claim 1, wherein said guide ring comprises:
an inner surface which is in contact with said semiconductor element;
an outer surface surrounding said inner wall surface of said insulating cylinder;
a top end surface connecting said inner surface and said outer surface of said guide ring with each other; and
a bottom end surface connecting said inner surface and said outer surface of said guide ring with each other; and
said arm is located on said top end surface of said guide ring.

3. The semiconductor device of claim 2, wherein said top end surface of said guide ring comprises
a flat portion surrounding a top opening of said guide ring; and
a convex portion projected from said flat portion and surrounding said top opening of said guide ring, wherein said flat portion is located at an outer surface side of said guide ring and said convex portion is located at an inner surface side of said guide ring; and
said arm crosses said convex portion and said flat portion.

4. The semiconductor device of claim 3, wherein said top end surface of said guide ring further comprises:
a notch formed across said convex portion; and said arm has:
a first portion which is connected to said central portion and which is received in said notch.

5. The semiconductor device of claim 4, wherein said top end surface of said guide ring further comprises
a channel formed across said flat portion and aligned with said notch; and
said first portion of said arm is received also in said channel.

6. The semiconductor device of claim 5, wherein a gap is provided in an interface between said guide ring and said insulating cylinder, wherein said gap is linked to said channel; and
said arm further comprises:
a second portion extending from said first portion and inserted into said gap.

7. The semiconductor device of claim 6, wherein said outer surface of said guide ring comprises
a recess linked to said channel, which serves as said gap.

8. The semiconductor device of claim 7, wherein said first and second portions of said arm engage with said guide ring.

9. The semiconductor device of claim 3, wherein said arm comprises:
a bride portion extending from said central portion and straddling said convex portion.

10. The semiconductor device of claim 9, wherein said arm further comprises:
a straight portion extending from said bridge portion and placed on said flat portion of said top end surface.

11. The semiconductor device of claim 1, wherein said electrode buffer plate comprises a plurality of arms each of which extends from said central portion to a vicinity of said inner wall surface of said insulating cylinder.

12. The semiconductor device of claim 11, wherein said plurality of arms are arranged along a circumference of said central portion with same intervals.

13. In a semiconductor device having a semiconductor substrate on which an electrode plate and an electrode conductor are placed, a plate member inserted between said electrode plate and said electrode conductor for buffering thermal stress caused between said electrode plate and said electrode conductor when a current flows through said semiconductor substrate, said plate member, comprising:
a central portion having a shape of a disk; and
a plurality of arms extending from a circumference of said central portion in a radial direction of said disk.

14. The plate member of claim 13, wherein said plurality of arms are arranged along said circumference with same intervals.

15. The plate member of claim 14, wherein each of said plurality of arms comprises:
a first portion extending from said circumference in said radial direction; and
a second portion connected to said first portion and hooked toward a direction perpendicular to a disk plane of said central portion.

16. A guide ring employable in a semiconductor device for restricting the position of a semiconductor element inserted in said guide ring, comprising:
an inner surface;
an outer wall surface surrounding said inner surface;
a bottom end surface connecting said inner and outer surfaces with each other;
a top end surface connecting said inner and outer surfaces with each other and having;
a flat portion surrounding a top opening of said guide ring; and
a convex portion projected from said flat portion and surrounding said top opening;
wherein
said flat portion is located at an outer surface side of said guide ring;
said convex portion is located at an inner surface side of said guide ring; and
a notch is formed across said convex portion.

17. The guide ring of claim 16, wherein
a channel aligned with said notch is formed across said flat portion.

18. The guide ring of claim 17, wherein
a recess linked to said channel is formed on said outer wall surface.

* * * * *